US012671399B2

(12) United States Patent
Geiger et al.

(10) Patent No.: US 12,671,399 B2
(45) Date of Patent: Jun. 30, 2026

(54) CONSTANT POWER ACTIVE DISCHARGE OF ENERGY STORAGE CIRCUIT

(71) Applicant: TEXAS INSTRUMENTS INCORPORATED, Dallas, TX (US)

(72) Inventors: John Geiger, Freising (DE); Toru Tanaka, Plano, TX (US); Adam L. Shook, Carrollton, TX (US); Rakesh Raja, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/591,835

(22) Filed: Feb. 29, 2024

(65) Prior Publication Data

US 2025/0279769 A1     Sep. 4, 2025

(51) Int. Cl.
| | |
|---|---|
| *H03K 3/023* | (2006.01) |
| *H03K 3/0233* | (2006.01) |
| *H03K 5/24* | (2006.01) |
| *H03K 17/22* | (2006.01) |
| *H03K 17/687* | (2006.01) |

(52) U.S. Cl.
CPC ......... *H03K 3/0233* (2013.01); *H03K 5/2481* (2013.01); *H03K 17/223* (2013.01); *H03K 17/6871* (2013.01)

(58) Field of Classification Search
CPC .. H03K 3/0233; H03K 5/2481; H03K 17/223; H03K 17/6871; H03K 17/0822; H03K 3/023; H03K 5/2472; H03K 5/249; H03K 17/082; B60L 58/10; H02M 1/322
See application file for complete search history.

(56) References Cited

U.S. PATENT DOCUMENTS

2013/0249508 A1*    9/2013    Rahimi ................. H02M 3/156
                                                              323/271
2023/0143379 A1      5/2023    Ruppert

FOREIGN PATENT DOCUMENTS

EP          3975402 B1      4/2024
JP          5470960 B2      4/2014
WO      2024002525 A1      1/2024

OTHER PUBLICATIONS

International Search Report mailed Jun. 6, 2025.

* cited by examiner

*Primary Examiner* — Jung Kim
(74) *Attorney, Agent, or Firm* — Zhenhai Fu; Frank D. Cimino

(57) ABSTRACT

A circuit includes a reference signal generator, a comparator, a one-shot circuit, and a gate driver. The reference signal generator has an output terminal, a first input terminal configured to receive a discharge time select value, and a second input terminal configured to receive a stop voltage select value. The comparator has an output terminal, a first input terminal configured to receive a sensed voltage, and a second input terminal coupled to the output terminal of the reference signal generator. The one-shot circuit has an output terminal, a first input terminal coupled to the output terminal of the comparator, and a second input terminal configured to receive an on-time value. The gate driver has an output terminal, and an input terminal coupled to the output terminal of the one-shot circuit.

7 Claims, 6 Drawing Sheets

600

602 — RECEIVE A SENSED VOLTAGE

604 — COMPARE THE SENSED VOLTAGE TO A REFERENCE VOLTAGE TO PROVIDE A COMPARISON RESULT

606 — RESPONSIVE TO THE COMPARISON RESULT HAVING AN ASSERTED VALUE AND A CLOCK SIGNAL HAVING AN ASSERTED VALUE, PROVIDE A PULSE SIGNAL

608 — CONTROL A TRANSISTOR ACCORDING TO THE PULSE SIGNAL TO BE CONDUCTIVE FOR AN ON-TIME TO PARTIALLY DISCHARGE A CAPACITOR

CONSTANT POWER ACTIVE DISCHARGE OF ENERGY STORAGE CIRCUIT

BACKGROUND

Various electrically powered systems may include energy storage circuits, such as capacitors. In some application environments, these energy storage circuits may pose a risk to users, such as if they retain a charge under certain operational circumstances, or retain a charge for greater than a threshold amount of time under certain operational circumstances.

SUMMARY

In some examples, a circuit includes a reference signal generator, a comparator, a one-shot circuit, and a gate driver. The reference signal generator has first and second input terminals and an output terminal, the first input terminal of the reference signal generator configured to receive a discharge time select value, and the second input terminal of the reference signal generator configured to receive a stop voltage select value. The comparator has first and second input terminals, and an output terminal, the first input terminal of the comparator configured to receive a sensed voltage, and the second input terminal of the comparator coupled to the output terminal of the reference signal generator. The one-shot circuit has first and second input terminals, and an output terminal, the first input terminal coupled to the output terminal of the comparator, and the second input terminal configured to receive an on-time value. The gate driver has an input terminal and an output terminal, the input terminal of the gate driver coupled to the output terminal of the one-shot circuit.

In some examples, a circuit is configured to receive a sensed voltage representative of a voltage of an energy storage circuit. The circuit is also configured to compare the sensed voltage to a reference signal representative of a discharge profile for the energy storage circuit. The circuit is also configured to, responsive to the sensed voltage having a value greater than the reference signal, control a gate driver to provide a control signal configured to discharge the energy storage circuit for a constant on-time period determined to cause a power discharge rate of the energy storage circuit to remain constant.

In some examples, a system includes a switch, a capacitor, a voltage sense circuit, a high-side drive circuit, a first transistor, a low-side drive circuit, and a second transistor. The switch has first and second terminals, the second terminal of the switch coupled to a positive power terminal. The capacitor has first and second terminals, the first terminal of the capacitor coupled to the first terminal of the switch, and the second terminal of the capacitor coupled a ground terminal. The voltage sense circuit has first and second terminals and an output terminal, the first terminal of the voltage sense circuit coupled to the first terminal of the switch, and the second terminal of the voltage sense circuit coupled to the ground terminal. The high-side drive circuit has an input terminal and an output terminal. The first transistor has first and second terminals, and a control terminal, the first terminal of the first transistor coupled to the first terminal of the switch, and the control terminal of the first transistor coupled to the output terminal of the high-side drive circuit. The low-side drive circuit has first and second input terminals and an output terminal, the first input terminal of the low-side drive circuit coupled to the output terminal of the voltage sense circuit. The second transistor has first and second terminals, and a control terminal, the first terminal of the second transistor coupled to the second terminal of the first transistor, the second terminal of the second transistor coupled to the ground terminal, and the control terminal of the second transistor coupled to the output terminal of the low-side drive circuit.

DETAILED DESCRIPTION

Figure 1:
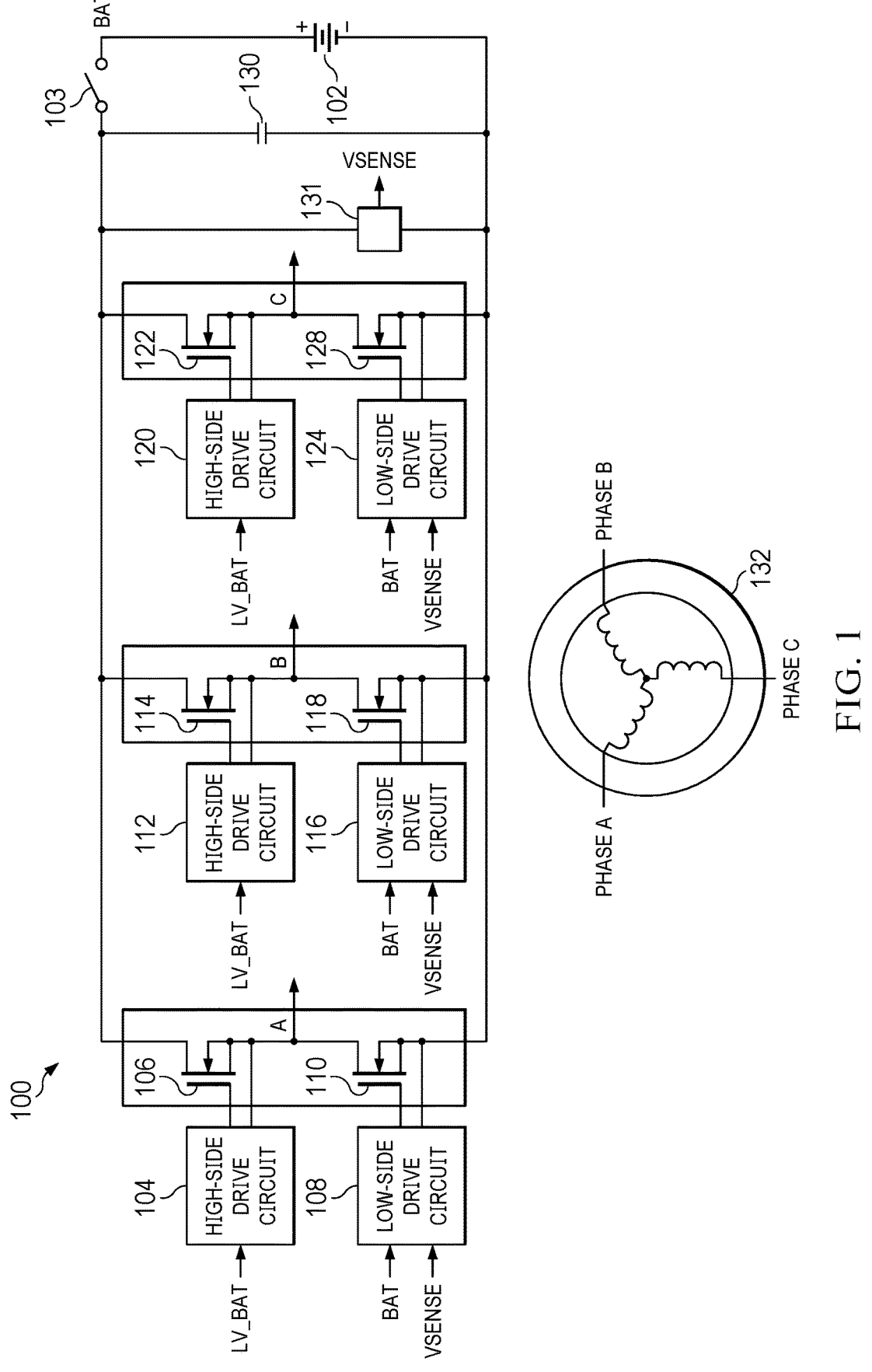
FIG. 1 is a block diagram of a system, in accordance with various examples.

As described above, various electrically powered systems may include energy storage circuits, such as capacitors. An example of such an electrically powered system may be an electrically powered vehicle, a hybrid power vehicle, an electric subsystem of a vehicle, or the like. As used herein, vehicle may include automobiles, trucks, boats, airplanes, helicopters, industrial (e.g., construction, farm, or the like) equipment, or any other suitable wheeled or tracked terrestrial vehicle, marine vehicle, or airborne vehicle. In some application environments, these energy storage circuits may pose a risk to users, such as if they retain a charge under certain operational circumstances, or retain a charge for greater than a threshold amount of time under certain operational circumstances. For example, a vehicle traction inverter system of a battery-powered, or hybrid-powered, vehicle may include a direct current (DC) link capacitor. The DC link capacitor may increase stability of a DC voltage provided to load, such as a vehicle traction inverter system, by supplementing power provided by a battery or other power source in response to sporadic or transient heavy-load conditions imposed by the vehicle traction inverter system on the power source. Even after the DC link capacitor is decoupled from a power source (e.g., battery) of the vehicle, the DC link capacitor may retain a charge and resulting voltage. In some examples, the voltage may be in a range of 800 volts (V) or greater. The DC link capacitor voltage may pose a risk to users in certain operational circumstances, such as in the event of a crash of the vehicle, during maintenance or other service of the vehicle, or the like. As a result, some safety regulations, regulations, laws, standards, or industry practices may specify a time duration and/or discharge rate for the DC link capacitor. For example, the time duration and/or discharge rate may specify that a voltage of the DC link capacitor should be decreased (e.g., discharged) to less than a threshold voltage within a permissible time range. In an example, the time range may be about 1 to about 5 seconds. In some examples, the threshold voltage may be about 60 V, about 40 V, between about 60 V and about 40 V, or any other suitable level or range of levels. Some approaches to discharging the DC link capacitor include discharging stored energy through a resistor. However, such approaches may generate large amounts of heat, may require comparatively large resistors (e.g., in physical size and/or resistance), or may otherwise be undesirable or unsuitable for certain application environments.

Examples of this description provide for active discharge of an energy storage circuit. In an example, the energy storage circuit is a capacitor, such as a DC link capacitor. In some examples, the active discharge provides for a constant power discharge rate in which a small change in voltage over time is seen at high voltages and a large change in voltage over time is seen at low voltages. The constant power discharge rate may be in contrast to a constant current discharge rate, reducing a peak junction temperature of power switches (e.g., transistors) in a critical path of the discharge. In an example, a voltage sensing circuit may provide a sensed signal indicative or otherwise representative of a DC link voltage (e.g., a voltage of the DC link capacitor). The voltage sensing circuit may be, in some examples, a voltage divider coupled in parallel with the DC link capacitor. The sensed signal may be compared to a reference signal. Based on that comparison, the DC link capacitor may be discharged. For example, the reference signal may be a reference waveform representative of a discharge waveform for the DC link capacitor. Responsive to the sensed signal having a value greater than the reference signal, and a clock signal having an asserted value, a gate driver drives a switch (e.g., a transistor) to discharge the DC link capacitor. In some examples, the gate driver drives the switch based on a pulsed input signal that de-asserts after a programmed amount of time. In this way, control is exerted over a rate of discharge of the DC link capacitor. By controlling the rate of discharge of the DC link capacitor, an increased amount of control may be provided over thermal characteristics of the system (e.g., power switches in a critical path of the discharge, passive components, etc.), increasing performance of the system, rendering the system suitable for implementation in a greater range of application environments, or the like. In some examples, to discharge the DC link capacitor, the switch (or multiple switches) are configured to create a path to ground (e.g., a short to ground) between the DC link capacitor and a ground terminal at which a ground voltage potential is provided. The switch (or switches) may be controlled to create the path to ground based on control exerted by the gate driver.

By modulating a control voltage (e.g., gate voltage) of the switches, the switches are controlled to create multiple short circuit events, discharging the DC link capacitor in a controlled manner. The control voltage is modulated based on a comparison of the sensed signal to the reference signal to implement pulse-frequency modulation (PFM) control. For example, a frequency of the short circuit events increases as the DC link voltage decreases.

FIG. 1 is a block diagram of a system 100, in accordance with various examples. In an example, the system 100 includes a power source 102 (e.g., a battery, an array of batteries, a battery cell, etc.), a switch 103, a high-side drive circuit 104, a transistor 106, a low-side drive circuit 108, a transistor 110, a high-side drive circuit 112, a transistor 114, a low-side drive circuit 116, a transistor 118, a high-side drive circuit 120, a transistor 122, a low-side drive circuit 124, a transistor 128, a capacitor 130, a voltage sense circuit 131, and a motor 132. In some examples, the capacitor 130 is a DC link capacitor. In an example, the motor 132 is a three-phase motor, having Phase A, Phase B, and Phase C terminals. The high-side drive circuit 104, transistor 106, low-side drive circuit 108, and transistor 110 may form a first branch for driving a first phase of the motor 132, the high-side drive circuit 112, transistor 114, low-side drive circuit 116, and transistor 118 may form a second branch for driving a second phase of the motor 132, and the high-side drive circuit 120, transistor 122, low-side drive circuit 124, and transistor 128 may form a third branch for driving a third phase of the motor 132. In some examples, the system 100 also includes a controller 134. In an example, the controller 134 controls operation of other components of the system 100, such as the high-side drive circuits 104, 112, 120, the low-side drive circuits 108, 116, 124, and/or the switch 103.

In an example architecture of the system 100, the power source 102 has a positive terminal and a negative, or ground, terminal. The switch 103 has first and second terminals, the second terminal of the switch 103 coupled to the positive terminal of the power source 102. The capacitor 130 has first and second terminals, the first terminal of the capacitor 130 coupled to the first terminal of the switch 103, and the second terminal of the capacitor 130 coupled to the ground terminal of the power source 102. The voltage sense circuit 131 has an output terminal and first and second terminals, the first terminal of the voltage sense circuit 131 coupled to the first terminal of the switch 103, and the second terminal of the voltage sense circuit 131 coupled to the ground terminal of the power source 102. The high-side drive circuit 104 has a first input terminal at which a low-voltage power supply (LV_BAT), which may be derived from the power source 102 or from any other suitable source, is provided, a second input terminal coupled to the controller 134, a third input terminal, and an output terminal. The transistor 106 has a first terminal coupled to the first terminal of the switch 103, a second terminal coupled to the third input terminal of the high-side drive circuit 104, and a control terminal coupled to the output terminal of the high-side drive circuit 104. The low-side drive circuit 108 has a first input terminal coupled to the positive terminal of the power source 102, a second input terminal coupled to the controller 134, a third input terminal coupled to the ground terminal of the power source 102, a fourth input terminal coupled to the output terminal of the voltage sense circuit 131, and an output terminal. The transistor 110 has a first terminal coupled to the second terminal of the transistor 106, a second terminal coupled to the ground terminal of the power source 102, and a control terminal coupled to the output terminal of the low-side drive circuit 108. In an example, the second terminal of the transistor 106 is coupled to the Phase A terminal of the motor 132.

The high-side drive circuit 112 has a first input terminal at which LV_BAT is provided, a second input terminal coupled to the controller 134, a third input terminal, and an output terminal. The transistor 114 has a first terminal coupled to the first terminal of the switch 103, a second terminal coupled to the third input terminal of the high-side drive circuit 112, and a control terminal coupled to the output terminal of the high-side drive circuit 112. The low-side drive circuit 116 has a first input terminal coupled to the positive terminal of the power source 102, a second input terminal coupled to the controller 134, a third input terminal coupled to the ground terminal of the power source 102, a fourth input terminal coupled to the output terminal of the voltage sense circuit 131, and an output terminal. The transistor 118 has a first terminal coupled to the second terminal of the transistor 114, a second terminal coupled to the ground terminal of the power source 102, and a control terminal coupled to the output terminal of the low-side drive circuit 116. In an example, the second terminal of the transistor 114 is coupled to the Phase B terminal of the motor 132.

The high-side drive circuit 120 has a first input terminal at which LV_BAT is provided, a second input terminal coupled to the controller 134, a third input terminal, and an output terminal. The transistor 122 has a first terminal coupled to the first terminal of the switch 103, a second terminal coupled to the third input terminal of the high-side drive circuit 120, and a control terminal coupled to the output terminal of the high-side drive circuit 120. The low-side drive circuit 124 has a first input terminal coupled to the positive terminal of the power source 102, a second input terminal coupled to the controller 134, a third input terminal coupled to the ground terminal of the power source 102, a fourth input terminal coupled to the output terminal of the voltage sense circuit 131, and an output terminal. The transistor 126 has a first terminal coupled to the second terminal of the transistor 122, a second terminal coupled to the ground terminal of the power source 102, and a control terminal coupled to the output terminal of the low-side drive circuit 124. In an example, the second terminal of the transistor 122 is coupled to the Phase C terminal of the motor 132.

The first branch, second branch, and third branch, as described above, are coupled in parallel with the capacitor 130 and each may be controlled to discharge the capacitor 130 individually, or in combination with another branch. For clarity of description, operation of discharging the capacitor 130 in the system 100 will be described with respect to the first branch, comprising the high-side drive circuit 104, transistor 106, low-side drive circuit 108, and transistor 110. However, in other examples, the second branch, or third branch, may alternatively, or additionally, be controlled to discharge the capacitor 130, and description herein with respect to the first branch discharging the capacitor 130 may be equally applicable to the second and/or third branches.

In an example of operation of the system 100, the controller 134 controls the high-side drive circuits 104, 112, 120, the low-side drive circuits 108, 116, 124, and/or the switch 103 to provide power from the power source 102 to the motor 132 to control or otherwise drive the motor 132. In an example, the control may be according to a pulse-width modulation signal received from any suitable source, such as the controller 134, the scope of which is not limited herein. As such, control of the high-side drive circuits 104, 112, 120, the low-side drive circuits 108, 116, 124, and/or the switch 103 to provide power to the motor 132 may be outside the scope of this disclosure, and description of which is omitted herein.

Responsive to opening of the switch 103 (e.g., de-coupling the high-side drive circuits 104, 112, 120 and the low-side drive circuits 108, 116, 124 from the positive terminal of the power source 102), the controller 134 may control one or more of the high-side drive circuits 104, 112, 120 and the low-side drive circuits 108, 116, 124 to discharge the capacitor 130. The discharging may be performed according to PFM such that the capacitor 130 is discharged at an approximately constant power rate, with a change in voltage over time of a voltage of the capacitor increasing as the voltage of the capacitor decreases.

For example, responsive to assertion of a safe state enable signal by the controller 134, the switch 103 may be opened. The safe state enable signal may be asserted by the controller 134 responsive to any suitable event, such as a key-off or turn-off event of the system 100, the system 100 entering a maintenance or service mode, detection of a crash of the system 100, detection of a fault or other anomalous condition of the system 100, or the like. Also responsive to assertion of the safe state enable signal, the high-side drive circuit 104 may control the transistor 106 to remain in a conductive, or turned-on, state.

Responsive to opening of the switch 103, the controller 134 may assert an active discharge enable signal. In some examples, asserting the active discharge enable signal includes providing the active discharge enable signal having a value of logic 1 (e.g., an active high signal). In other examples, asserting the active discharge enable signal includes providing the active discharge enable signal having a value of logic 0 (e.g., an active low signal). Responsive to assertion of the active discharge enable signal, the low-side drive circuit 108 may modulate a control signal provided at the control terminal of the transistor 110. By modulating the control voltage, the low-side drive circuit 108 controls the transistor 110 to be in alternating conductive and non-conductive states, creating short circuit events between the first terminal of the capacitor 130 and the ground terminal of the power source 102. During these short circuit events while the transistor 110 is conductive, a portion of charge stored by the capacitor 130 discharges, reducing a voltage of the capacitor 130. In an example, each conductive period of the transistor 110, and therefore each short circuit event, is a constant on-time event. In this way, each discharge period may have approximately a same duration. However, a frequency of the short circuit events, and therefore a frequency of the discharge periods, may increase as the voltage of the capacitor 130 decreases. In this way, the low-side drive circuit 108 modulates the control signal provided at the control terminal of the transistor 110 according to PFM.

In some examples, the low-side drive circuit 108 modulates the control signal based on a comparison of a sensed voltage (VSENSE) provided by the voltage sense circuit 131 and a reference voltage. In other examples, the low-side drive circuit 108 modulates the control signal based on a discharge control signal received from any suitable source, such as the controller 134, the scope of which is not limited herein. In some examples, the voltage sense circuit 131 includes, or is implemented as, a resistor-based voltage divider (or voltage divider of any other suitable architecture) such that the sensed voltage is proportional to the voltage of the capacitor 130. The low-side drive circuit 108 may compare the sensed voltage to a reference voltage or reference signal. In some examples, the reference signal is a waveform provided by a signal generator. The signal generator may generate the waveform based on a discharge time and a stop voltage, which may be received by the low-side drive circuit 108 from the controller 134, received by the low-side drive circuit 108 as externally provided user input, retrieved by the low-side drive circuit 108 from a register or other storage device or location, or hard-coded to the low-side drive circuit 108. Responsive to the sensed voltage having a value greater than or equal to the reference voltage, the low-side drive circuit 108 may provide the control signal to the transistor 110 having a pulse asserted for a programmed amount of time (e.g., an "on time"). The pulse may be an active-high pulse or an active-low pulse, as described above, depending on a process technology of the transistor 110.

In some examples, the programmed amount of time may be received by the low-side drive circuit 108 from the controller 134, received by the low-side drive circuit 108 as externally provided user input, retrieved by the low-side drive circuit 108 from a register or other storage device or location, or hard-coded to the low-side drive circuit 108. In some examples, the low-side drive circuit 108 may limit a frequency of the modulation of the control signal. In such examples, the low-side drive circuit 108 may provide the control signal to the transistor 110 having the pulse asserted for the programmed amount of time responsive to both the sensed voltage having a value greater than or equal to the reference voltage, and a clock signal having an asserted value. In some examples, the clock signal may be provided by a clock generator based on the sensed voltage and a clock frequency limit value. The clock frequency limit value may be received by the low-side drive circuit 108 from the controller 134, received by the low-side drive circuit 108 as externally provided user input, retrieved by the low-side drive circuit 108 from a register or other storage device or location, or hard-coded to the low-side drive circuit 108. In some examples, the average discharge current is proportional to the clock signal. At high voltage, a lower frequency the clock signal is provided to maintain constant power discharge, as described herein. To mitigate excessive average discharge current during a fault scenario, the frequency of the clock signal may be scaled inversely proportional to the sensed voltage.

In some examples, the low-side drive circuit 108 may monitor the discharge process for the presence of a fault. For example, the low-side drive circuit 108 may compare the sensed voltage to a fault reference voltage comprising the reference voltage plus a fault offset value. The fault offset value may be received by the low-side drive circuit 108 from the controller 134, received by the low-side drive circuit 108 as externally provided user input, retrieved by the low-side drive circuit 108 from a register or other storage device or location, or hard-coded to the low-side drive circuit 108. Responsive to the sensed voltage exceeding the fault reference value, the low-side drive circuit 108 may assert a fault signal. Responsive to assertion of the fault signal, the low-side drive circuit 108 may disable discharge of the capacitor 130 by the low-side drive circuit 108. The disabling of discharge of the capacitor 130 by the low-side drive circuit 108 responsive to assertion of the fault signal may be performed according to any suitable process, and via any additional supporting components (not shown), the scope of which is not limited herein. In some examples, the low-side drive circuit 108 may provide the fault signal to the controller 134 for communication to any one or more of the high-side drive circuits 104, 112, 120, the low-side drive circuits 116, 124, and/or any other suitable devices. In other examples, the low-side drive circuit 108 may itself provide the fault signal to any one or more of the high-side drive circuits 104, 112, 120, the low-side drive circuits 116, 124, and/or any other suitable devices.

In some examples, responsive to the low-side drive circuit 108 determining and reporting the fault, and consequently disabling discharge of the capacitor 130 by the low-side drive circuit 108, one or more of the low-side drive circuit 116, 124 may attempt to discharge the capacitor 130 in a manner substantially similar to that described above with respect to the low-side drive circuit 108. In some examples, responsive to the low-side drive circuit 108 determining and reporting the fault, a notification may be provided to a user, or to another circuit, component, or device. The notification may take any form, such as a visual notification, an audible notification, a text notification, a notification transmitted via a network interface, an analog or digital signal transmitted between electrical components, or the like.

Figure 2:
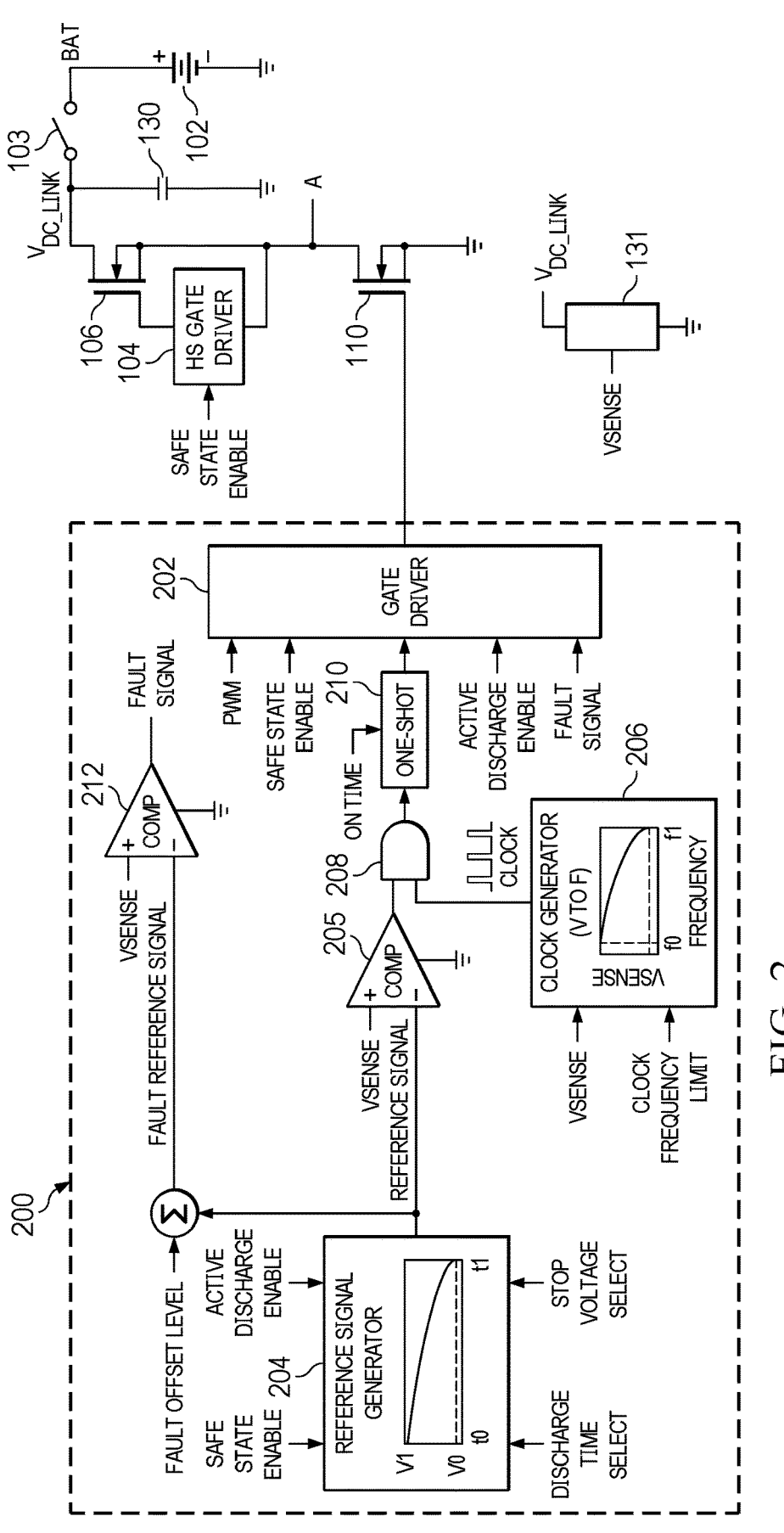
FIG. 2 is a block diagram of a drive circuit, in accordance with various examples.

FIG. 2 is a schematic diagram of a drive circuit 200, in accordance with various examples. In various examples, the drive circuit 200 is suitable for implementation as any one or more of the low-side drive circuits 108, 116, 124. In an example, the drive circuit 200 includes a gate driver 202, a reference signal generator 204, a comparator 205, a clock generator 206, an AND logic circuit 208, a one-shot circuit 210, and a comparator 212. The reference signal generator

204 and the clock generator 206 may each be implemented according to any suitable architecture, the scope of which is not limited herein. In some examples, the reference signal generator 204 is implemented as a lookup table which may provide a time to spend at each voltage level. For example, across a time range $t0$ to $t1$, the reference signal generator 204 provides a voltage having a decreasing value beginning at $V1$ and decreasing to $V1$ in multiple discrete voltage levels as time increases from $t0$ to $t1$. In some examples, the clock generator 206 is implemented using a combination of a lookup table that provides an increasing pulse-width modulation (PWM) frequency as voltage decreases, and a PWM generator that generates a PWM signal at the PWM frequency for each voltage level. In some examples, the one-shot circuit 210 may be implemented as a multivibrator, such as a monostable multivibrator. In other examples, the one-shot circuit 210 may be implemented according to any suitable architecture or as any suitable circuit capable of generating or providing a constant on time pulse signal responsive to a received signal. The gate driver 202 may be implemented according to any suitable architecture, the scope of which is not limited herein.

In an example, the reference signal generator 204 has an output terminal, and has a first input terminal configured to receive a safe state enable signal, a second input terminal configured to receive an active discharge enable signal, a third input terminal configured to receive a discharge time select value, and a fourth input terminal configured to receive a stop voltage select value. In various examples, any one or more of the first through fourth input terminals of the reference signal generator 204 may be coupled to respective output terminals of the controller 134, or any other suitable signal sources, as described elsewhere herein. The comparator 205 has a first input terminal configured to receive a sensed voltage, a second input terminal coupled to the output terminal of the reference signal generator 204, and has an output terminal. In some examples, the first input terminal of the comparator 205 is coupled to the output terminal of the voltage sense circuit 131 to receive the sensed voltage from the voltage sense circuit 131. In some examples, the drive circuit 200 does not implement a limit on a frequency according to which the drive circuit implemented PFM control of the transistor 110. In such examples, the output terminal of the comparator 205 may be coupled to an input terminal of the one-shot circuit 210.

In other examples, the clock generator 206 has a first input terminal configured to receive the sensed voltage (e.g., coupled to the output terminal of the voltage sense circuit 131 to receive the sensed voltage from the voltage sense circuit 131), a second input terminal configured to receive a clock frequency limit value, and has an output terminal. In some examples, the second input terminal of the clock generator 206 may be coupled to an output terminal of the controller 134, or any other suitable signal source, as described elsewhere herein. The AND logic circuit 208 has a first input terminal coupled to the output terminal of the comparator 205, a second input terminal coupled to the output terminal of the clock generator 206, and has an output terminal. The one-shot circuit 210 has a first input terminal coupled to the output terminal of the AND logic circuit 208, a second input terminal configured to receive an on-time value, and has an output terminal coupled to the gate driver 202. In some examples, the second input terminal of the one-shot circuit 210 may be coupled to an output terminal of the controller 134, or any other suitable signal source, as described elsewhere herein.

Operation of the drive circuit 200 will be described herein under an operational circumstance in which both the safe state enable signal and the active discharge enable signal have asserted values, as described above herein. In such an example of operation of the drive circuit 200, the reference signal generator 204 provides a reference signal based on the discharge time select value (e.g., specifying t1) and stop voltage select value (e.g., specifying V1), which may specify a discharge time for discharging the capacitor 130 and a voltage to which the capacitor 130 is discharged in that discharge time. The comparator 205 receives the sensed voltage, which may be representative of a voltage of the capacitor 130, from the voltage sense circuit 131, and receives the reference signal from the reference signal generator 204. In an example, the reference signal emulates the voltage waveform of a capacitor discharged at constant power. Responsive to the sensed voltage having a value greater than the reference signal, the comparator 205 provides a comparison result having a value of logic 1. Responsive to the sensed voltage not having a value greater than the reference signal, the comparator 205 provides the comparison result have a value of logic 0.

The clock generator 206 provides a clock signal (CLOCK) based on the clock frequency limit value, which may specify a maximum frequency of a control signal for controlling the transistor 110. CLOCK may vary from a first frequency f0 to a second frequency f1 with changes to the sensed voltage. Responsive to the comparison result having the value of logic 1 and the clock signal provided by the clock generator 206 having a value of logic 1, the AND logic circuit 208 provides a logic result having a value of logic 1. Responsive to either the comparison result having a value of logic 0 or the clock signal provided by the clock generator 206 having a value of logic 0, the AND logic circuit 208 provides a logic result having a value of logic 0. Responsive to the logic result having the value of logic 1, the one-shot circuit 210 provides a signal pulse to the gate driver 202. The signal pulse may have a pulse width specified according to the on-time value received by the one-shot circuit 210.

Responsive to the signal pulse provided by the one-shot circuit 210 having an asserted value, the gate driver 202 provides the control signal to the transistor 110 to cause the transistor 110 to be conductive. The transistor 110 being conductive creates a short circuit event from the capacitor 130, through the transistor 106 and the transistor 110 to ground (e.g., the ground terminal of the power source 102) to partially discharge the capacitor 130. The above operation may repeat until the sensed voltage decreases to approximately equal, or be less than, the stop voltage select value.

As described above, in some examples, the drive circuit 200 includes fault detection, implemented at least in part by the comparator 212. For example, the reference signal is summed with a fault offset value to form a fault reference signal. While FIG. 2 includes a discrete summation component to add the reference signal and the fault offset value, the summation may instead be inherent, implemented by coupling two analog signal lines together. The comparator 212 receives the sensed voltage and the fault reference signal. Responsive to the sensed voltage having a value greater than the fault reference signal, the comparator 205 provides a comparison result having a value of logic 1. Responsive to the sensed voltage not having a value greater than the fault reference signal, the comparator 205 provides the comparison result have a value of logic 0. Responsive to the fault signal having the value of logic 0, the drive circuit 200 determines that a fault condition related to discharge of the capacitor 130 does not exist. Responsive to the fault signal having the value of logic 1, the drive circuit 200 determines that a fault condition related to discharge of the capacitor 130 exists. Responsive to determining that the fault condition exists, the drive circuit 200 may cease discharging, or attempting to discharge, the capacitor 130. In various examples, the drive circuit 200 may cease discharging, or attempting to discharge, the capacitor 130 responsive to other events, such as determining that a temperature of the transistor 110, or any other component of the drive circuit 200 or system 100 exceeds a threshold value.

Figure 3:
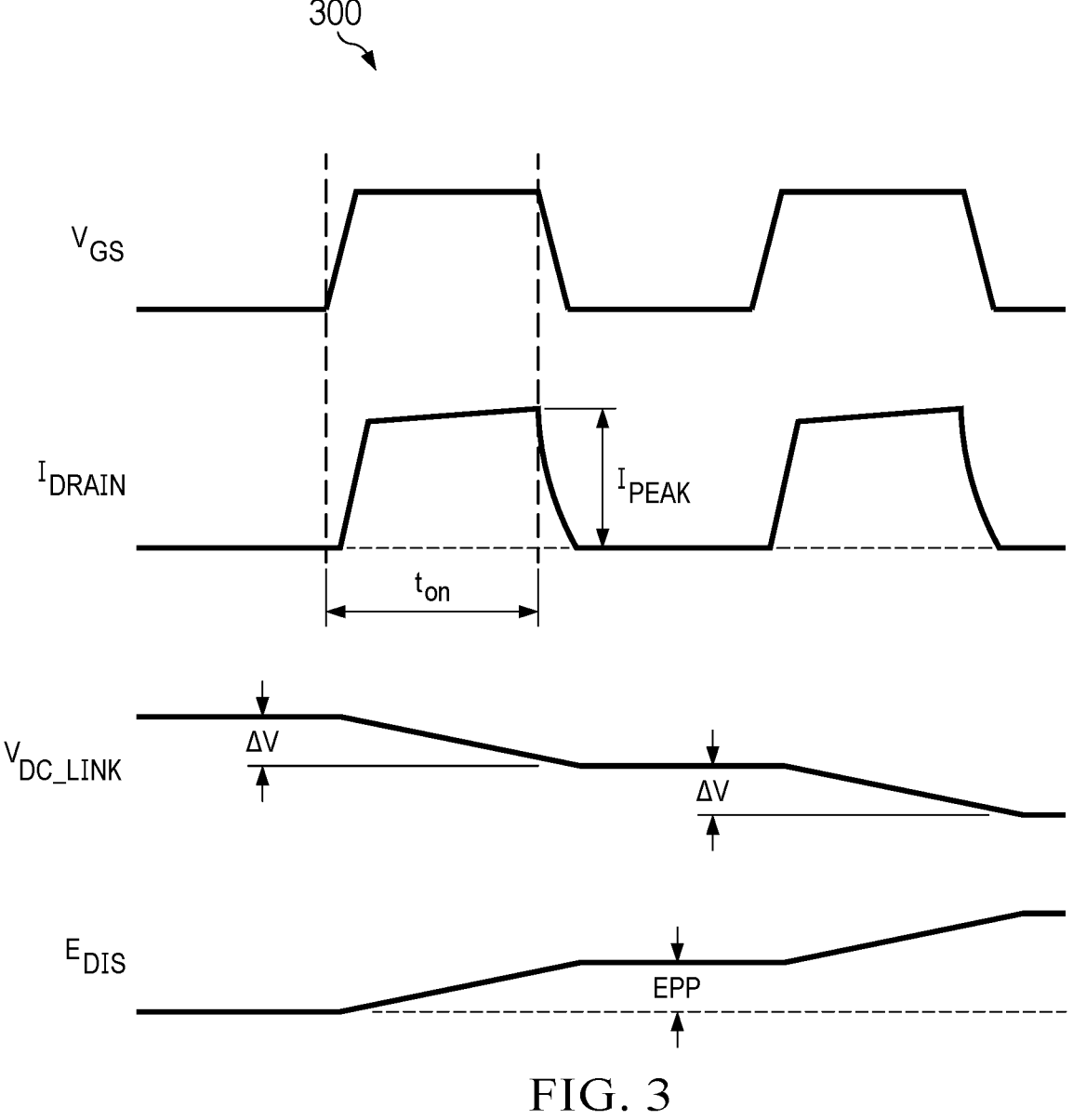
FIG. 3 is a diagram of signal waveforms, in accordance with various examples.

FIG. 3 is a diagram 300 of signal waveforms, in accordance with various examples. In an example, the signals of the diagram 300 may be provided in a system such as the system 100. In an example, the diagram 300 includes a signal $V_{GS}$, representative of a gate-to-source voltage of the transistor 110, a signal $I_{DRAIN}$, representative of a drain current of the transistor 110, a signal $V_{DC\_LINK}$, representative of a voltage of the capacitor 130, and a signal $E_{DIS}$, representative of an amount of energy discharged from the capacitor 130. As shown by the diagram 300, responsive to an increase in $V_{GS}$ and $I_{DRAIN}$, $V_{DC\_LINK}$ decreases in value by an amount $\Delta V$ and $E_{DIS}$ increases. As further shown by the diagram 300, an on-time of the transistor 110, based on the pulsed signal provided by the one-shot circuit 210, is $t_{on}$. In an example, a maximum voltage of the control signal provided to the transistor 110 may be selected to control a peak drain current ($I_{PEAK}$) of the transistor 110, such as to control, along with $t_{on}$, an amount of energy discharged (EPP) from the capacitor 130 for each signal pulse provided by the one-shot circuit 210.

Figure 4:
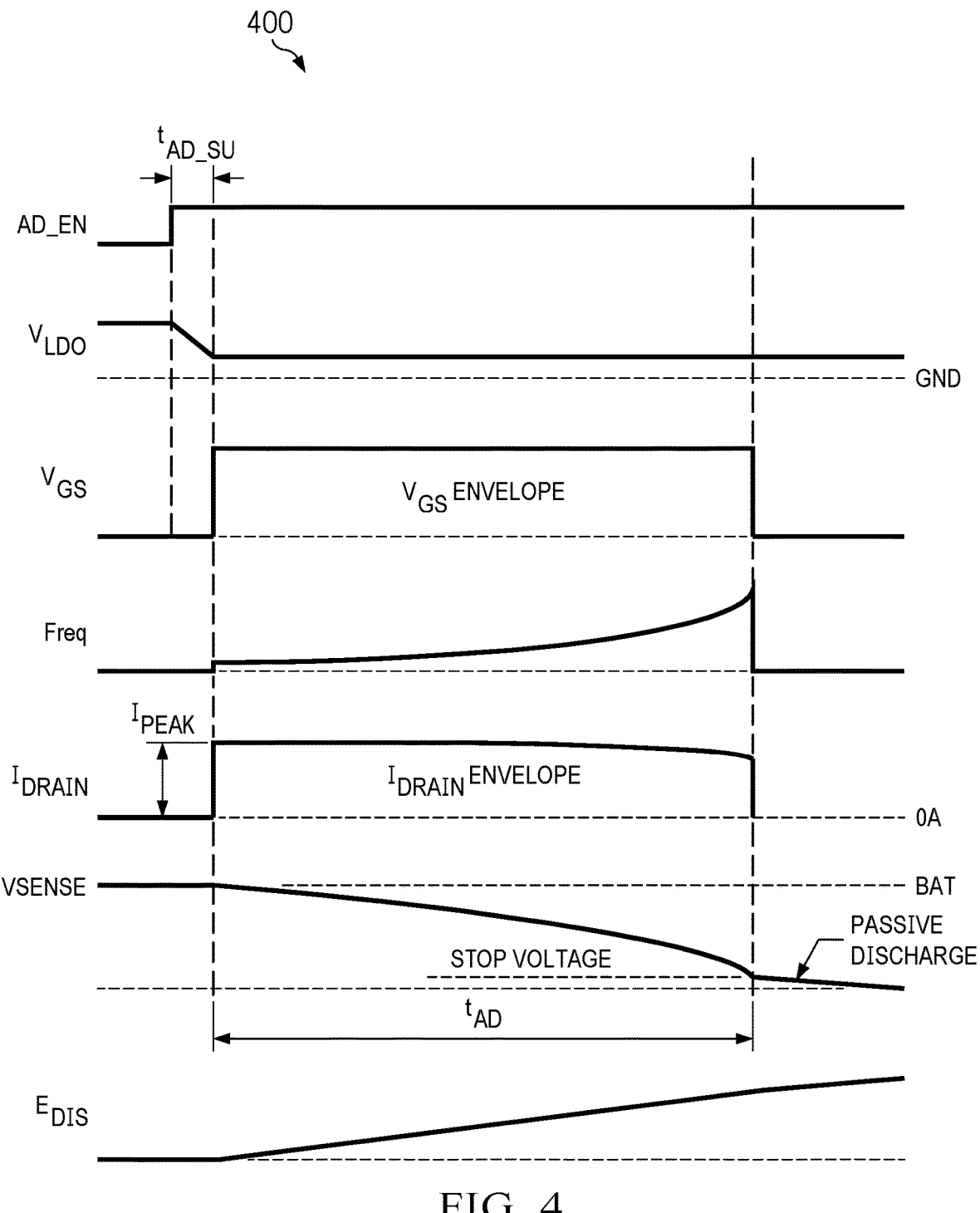
FIG. 4 is a diagram of signal waveforms, in accordance with various examples.

FIG. 4 is a diagram 400 of signal waveforms, in accordance with various examples. In an example, the signals of the diagram 400 may be provided in a system such as the system 100. In an example, the diagram 400 includes a signal AD_EN, representative of the active signal discharge enable signal, a signal $V_{LDO}$, representative of a maximum value for the control signal, a signal envelope of $V_{GS}$, a signal representative of a signal envelope of a frequency of the control signal (Freq), a signal envelope of $I_{DRAIN}$, $V_{DC\_LINK}$, and $E_{DIS}$. As shown by the diagram 400, responsive to assertion of AD_EN, during a setup time $t_{AD\_SU}$, $V_{LDO}$ decreases in value, such as to limit $I_{PEAK}$ of the transistor 110, as described above. At a completion of the setup time, the drive circuit 200 controls the transistor 110 according to PFM, as described above, to discharge the capacitor 130. As the drive circuit 200 controls the transistor 110 to discharge the capacitor 130, $V_{GS}$ and $I_{DRAIN}$ increase in value, as shown by the signal envelopes of $V_{GS}$ and $I_{DRAIN}$. As shown by the signal envelope of Freq, the pulse frequency of the control signal by which the drive circuit 200 controls the transistor 110 dynamically increases to provide an approximately constant-power discharge, as shown by the approximately linear $E_{DIS}$ as $V_{DC\_LINK}$ decreases in value. As further shown by FIG. 4, the active discharge of the capacitor 130 may continue for an active discharge time ($t_{AD}$) until $V_{DC\_LINK}$ has decreased to approximately equal the stop voltage select value. The capacitor 130 may continue to discharge passively following an end of $t_{AD}$.

Figure 5:
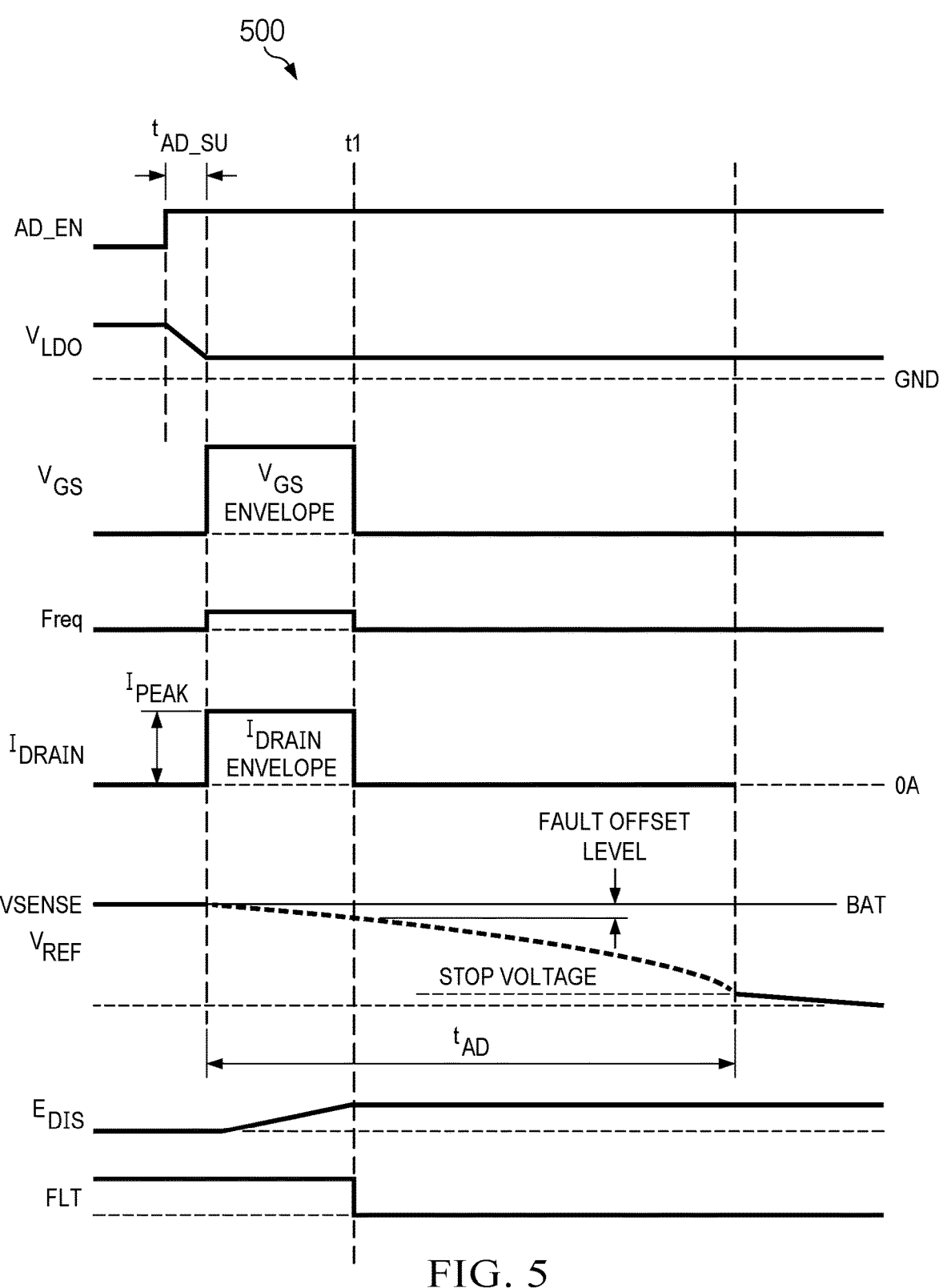
FIG. 5 is a diagram of signal waveforms, in accordance with various examples.

FIG. 5 is a diagram 500 of signal waveforms, in accordance with various examples. In an example, the signals of the diagram 500 may be provided in a system such as the system 100. In an example, the diagram 500 includes the signals of the diagram 400, as well as the fault reference signal $V_{REF}$, as described above herein. As shown by the diagram 500, responsive to assertion of AD_EN, during a setup time $t_{AD\_SU}$, $V_{LDO}$ decreases in value, such as to limit $I_{PEAK}$ of the transistor 110, as described above. At a completion of the setup time, the drive circuit 200 controls the transistor 110 according to PFM, as described above, to discharge the capacitor 130. As the drive circuit 200 controls the transistor 110 to discharge the capacitor 130, $V_{GS}$ and $I_{DRAIN}$ increase in value, as shown by the signal envelopes of $V_{GS}$ and $I_{DRAIN}$. As shown by the signal envelope of Freq, the pulse frequency of the control signal by which the drive circuit 200 controls the transistor 110 dynamically increases to provide an approximately constant-power discharge. However, at time t1, a difference in value between VSENSE and $V_{REF}$ exceeds the offset value, as described above. Responsive to the difference in value between VSENSE and the $V_{REF}$ exceeding the offset value (shown in FIG. 5 as FAULT OFFSET LEVEL), a fault signal (FLT) is asserted, or provided having a value of logic 0. Responsive to assertion of the fault signal, active discharge of the capacitor 130 by the low-side drive circuit 108 (or more generally, a drive circuit 200, as described above herein) may be disabled. In some examples, the drive circuit for which active discharge is disabled may reattempt active discharge after a programmed amount of time, or another drive circuit (e.g., one, or both of, the low-side drive circuits 116, 124 when active discharge is disabled for the low-side drive circuit 108) may attempt active discharge, of the capacitor 130.

Figure 6:
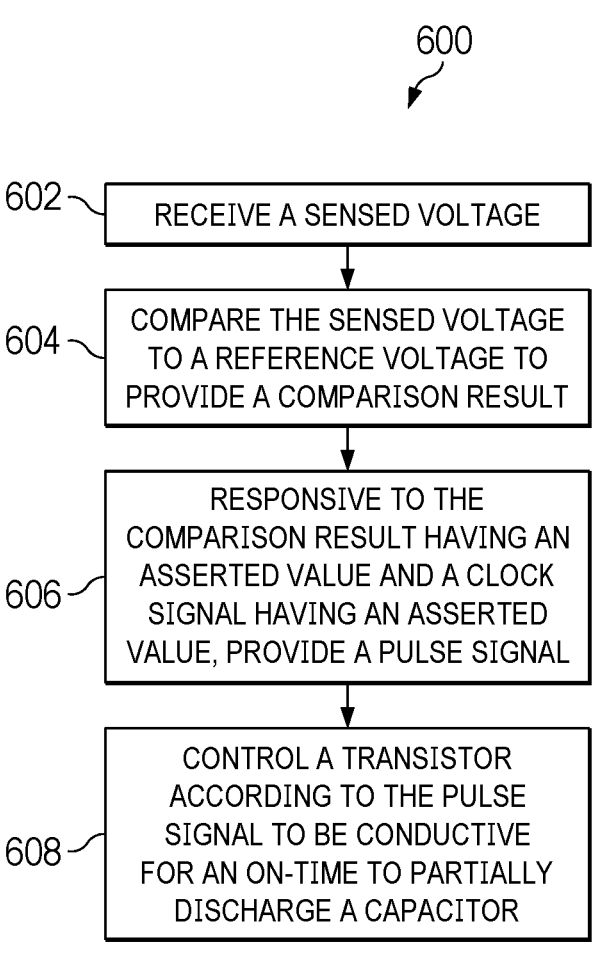
FIG. 6 is a flowchart of a method, in accordance with various examples.

FIG. 6 is a flowchart of a method 600, in accordance with various examples. In an example, the method 600 is representative of at least some operations performed by a drive circuit, such as the drive circuit 200. For example, the method 600 may be representative of at least some operations performed by the drive circuit 200 implemented as a low-side drive circuit 108, 116, 124, as described above herein. In at least some examples, the method 600 is implemented to discharge a capacitor, such as the capacitor 130, via a series of short-circuit events. In some examples, the discharge is performed according to PFM to provide an approximately constant, or linear, rate of power discharge.

At operation 602, a sensed voltage is received. In some examples, the sensed voltage is received from a voltage sensing circuit, such as a voltage divider. The sensed voltage may be representative of, proportional to, or otherwise indicate a value of a voltage of a capacitor, such as a DC link capacitor.

At operation 604, the sensed voltage is compared to a reference voltage to provide a comparison result. In some examples, the reference voltage is a reference signal waveform indicating a discharge curve for discharging the capacitor. In some examples, the reference voltage may be determined at a particular point in time based on a discharge time select value and a stop voltage select value, which may be obtained from any suitable source.

At operation 606, responsive to the comparison result having an asserted value and a clock signal having an asserted value, a pulse signal is provided. In some examples, the clock signal is provided based on a clock frequency limit value that may limit a frequency of the pulse signal. The pulse signal may be provided, for example, by a one-shot circuit having a constant on-time.

At operation 608, a transistor is controlled, according to the pulse signal, to be conductive for the on-time to partially discharge the capacitor. In some examples, controlling the transistor to become conductive creates a short-circuit event during which energy discharges from the capacitor, decreasing a voltage of the capacitor (and, consequently, decreasing the sensed voltage).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

What is claimed is:

1. A circuit, comprising:

a reference signal generator having first and second input terminals and an output terminal, the first input terminal of the reference signal generator configured to receive a discharge time select value indicating a discharge time, and the second input terminal of the reference signal generator configured to receive a stop voltage select value indicating a target voltage to discharge to within the discharge time;

a comparator having first and second input terminals, and an output terminal, the first input terminal of the comparator configured to receive a sensed voltage, and the second input terminal of the comparator coupled to the output terminal of the reference signal generator;

a one-shot circuit having first and second input terminals, and an output terminal, the first input terminal of the one-shot circuit coupled to the output terminal of the comparator, and the second input terminal of the one-shot circuit configured to receive an on-time value; and a gate driver having an input terminal and an output terminal, the input terminal of the gate driver coupled to the output terminal of the one-shot circuit.

2. The circuit of claim 1, further comprising:

an AND logic circuit having first and second input terminals, and an output terminal, the first input terminal of the AND logic circuit coupled to the output terminal of the comparator, and the output terminal of the AND logic circuit coupled to the first input terminal of the one-shot circuit; and a clock generator having an output terminal coupled to the second input terminal of the AND logic circuit.

3. The circuit of claim 1, further comprising a second comparator having first and second inputs, and an output terminal, the first input terminal of the second comparator coupled to the first input terminal of the comparator, the second input terminal configured to receive a fault reference signal formed by adding a fault offset level value to a reference signal provided by the reference signal generator, and the output terminal of the second comparator coupled to a second input terminal of the gate driver.

4. The circuit of claim 1, further comprising a voltage sense circuit having first and second terminals, and an output terminal, the second terminal of the voltage sense circuit coupled to a ground terminal, and the output terminal of the voltage sense circuit coupled to the first input terminal of the comparator.

5. The circuit of claim 4, wherein the voltage sense circuit comprises a voltage divider having an output coupled to the first input terminal of the comparator.

6. The circuit of claim 4, further comprising a capacitor having first and second terminals, the first terminal of the capacitor coupled to the first terminal of the voltage sense circuit, and the second terminal of the capacitor coupled to the ground terminal.

7. The circuit of claim 4, further comprising a transistor having first and second terminals, and having a control terminal, the first terminal of the transistor coupled to the first terminal of the voltage sense circuit, the second terminal of the transistor coupled to the ground terminal, and the control terminal of the transistor coupled to the output terminal of the gate driver.

* * * * *